United States Patent [19]

Lee et al.

[11] Patent Number: 5,420,058

[45] Date of Patent: May 30, 1995

[54] METHOD OF MAKING FIELD EFFECT TRANSISTOR WITH A SEALED DIFFUSION JUNCTION

[75] Inventors: Kuo-Hua Lee; Chun-Ting Liu, Both of Wescosville, Pa.; Ruichen Liu, Warren, N.J.

[73] Assignee: AT&T Corp., Murray Hill, N.J.

[21] Appl. No.: 160,600

[22] Filed: Dec. 1, 1993

[51] Int. Cl.[6] ........................................... H01L 21/225
[52] U.S. Cl. ..................................... 437/41; 437/161; 437/190; 437/200; 437/950
[58] Field of Search ................. 437/41, 161, 190, 200, 437/950; 148/DIG. 144, DIG. 147; 257/751

[56] References Cited

U.S. PATENT DOCUMENTS

| | | | |
|---|---|---|---|
| 4,764,481 | 8/1988 | Alvi et al. | 437/161 |
| 4,788,160 | 11/1988 | Havemann et al. | 437/200 |
| 4,844,776 | 7/1989 | Lee et al. | 156/653 |
| 4,922,311 | 5/1990 | Lee et al. | 257/751 |

*Primary Examiner*—Chandra Chaudhari
*Attorney, Agent, or Firm*—Richard D. Laumann

[57] ABSTRACT

A field effect transistor is fabricated with an ion implanted silicide layer and a conducting diffusion barrier pad layer that acts as a diffusion mask. The dopants from the silicide layer are diffused into the substrate to form shallow source/drain regions.

10 Claims, 1 Drawing Sheet

METHOD OF MAKING FIELD EFFECT TRANSISTOR WITH A SEALED DIFFUSION JUNCTION

TECHNICAL FIELD

This invention relates generally to the field of field effect transistors and particularly to the field of such transistors that have sealed diffusion junctions.

BACKGROUND OF THE INVENTION

As integrated circuits have become more complex, the individual devices, such as field effect transistors, forming the integrated circuit have become smaller and more closely spaced to each other. Simple shrinkage of device dimensions was not alone sufficient to permit the increased complexity of the circuits; new processing technologies and innovative devices were also required.

An example will illustrate this point. The source and drain regions of a field effect transistor must be separately electrically contacted. This is frequently done by depositing a dielectric layer over the transistor, patterning the dielectric layer to fore windows which expose portions of the source/drain regions, and then depositing metal in the windows. A typical metal is aluminum. However, aluminum tends to diffuse or spike into the silicon substrate. Such diffusion is undesirable. Diffusion barrier layers am deposited between the substrate and the aluminum to prevent the diffusion and spiking. Deposition of the brier layer material into the windows in the patterned dielectric frequently results in poor coverage of the substrate near the bottoms of the windows. Of course, the dielectric windows must be accurately positioned with respect to the source/drain regions.

An innovative design which decreases the alignment accuracy required for the dielectric windows is described in U.S. Pat. Nos. 4,844,776 and 4,922,311 issued to K. -H. Lee, C. -Y. Lu and D Yaney. These patents describe both a device and a method for making the device which is termed a folded extended window field effect transistor and is commonly referred to by the acronym FEWMOS. In an exemplary embodiment, a layer of a conducting material, such as TiN, is blanket deposited after transistor elements, including an insulating layer on top of the gate electrode, are formed. The conducting material is patterned to form window or landing pads which cover at least portions of the source/drain regions. The window pads may be larger than the source/drain regions provided that they do not contact each other on top of the gate electrode; they may also extend onto the field oxide regions adjacent the source/drain regions. Improved tolerance for misalignment is obtained. The window pads act as etch stop layers when the windows in the dielectric are etched thereby preventing etching into the source/drain regions.

Dopants must be put into the substrate to form the source/drain regions. This is frequently done by ion implantation. There are many device characteristics that are enhanced by forming shallow junctions; that is, very shallow source/drain regions. Shallow regions may be difficult to fabricate with ion implantation while at the same time maintaining a smooth surface to avoid junction interface roughness. In one embodiment, FEWMOS teaches the use of a polycide as the window pad layer material. The source/drain regions are formed by a thermal drive out from ion implanted polysilicon. A metal is deposited and a salicide formed. However, salicided polysilicon may lead to junction roughness.

SUMMARY OF THE INVENTION

According to an exemplary embodiment of this invention, a field effect transistor having a landing pad is fabricated by forming the gate electrode of a transistor between field oxide regions, and depositing a first silicide layer and a conducting landing pad layer which acts as a diffusion barrier layer to seal the junction. A layer of dielectric is then deposited and is followed by photoresist patterning to expose selected portions of the dielectric layer which are then removed. The patterned dielectric layer is used as an etch mask to pattern the conducting landing pad and first silicide layers. In a preferred embodiment, dielectric spacers are formed on the patterned dielectric layer prior to etching. The dielectric layer need not be removed although portions are etched to expose the landing pad layer. The first silicide layer has a dopant which diffuses into the substrate upon heating to form shallow junction source/drain regions between the gate electrode and the field oxide regions. Device fabrication is then continued. Another dielectric layer is deposited and windows opened which expose selected portions of the landing pad layer. The landing pad layer functions as an etch stop layer. A conducting material is deposited into the windows to form electrical contacts.

Figure 1:
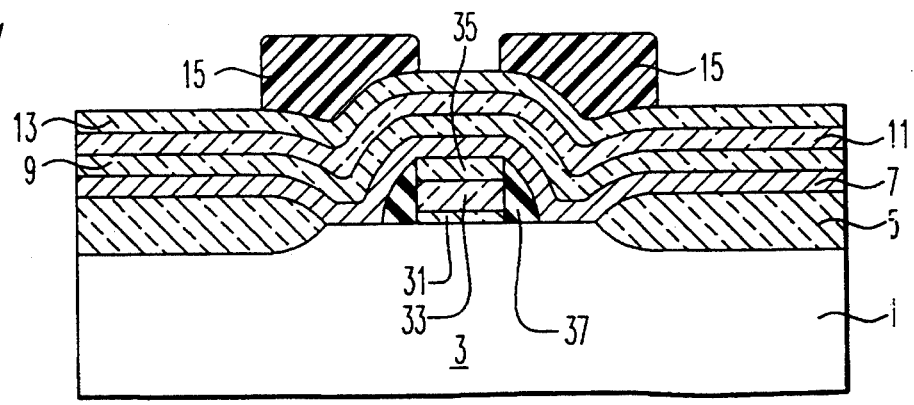
FIGS. 1–4 are sectional views of a portion of a device at various stages of fabrication according to this invention.

For reasons of clarity, the elements depicted are not shown to scale.

DETAILED DESCRIPTION

The invention will be described by reference to an exemplary embodiment. FIG. I is a sectional view showing substrate 1, gate electrode 3, field oxide regions 5, first silicide layer 7, conducting diffusion barrier layer 9, second silicide layer 11, dielectric layer 13, and patterned photoresist layer 15. Layers 9 and 11 may be referred as stacked landing pad layers. The gate electrode 3 is between the field oxide region 5. The gate electrode 3 has gate oxide 31, conducting layer 33, insulating top layer 35, and dielectric sidewalls 37. The patterned resist 15 exposes portions of the dielectric layer 13 that cover the portions of the stacked landing pad layers that will be removed.

The structure depicted will be readily formed by those skilled in the art using well known materials and well known techniques. The substrate 1 is typically silicon and the conducting layer 33 in the gate electrode 3 is typically polysilicon. The gate electrode of the field effect transistor, as well as the field oxide regions, will be readily fabricated by those skilled in the an typically using conventional deposition and patterning techniques. The dielectric layer 13, the insulating top layer 35, and the insulating sidewalls 37 are typically silicon oxides. The first and second silicide layers are formed from conducting silicides such as $WSi_2$ which is deposited. $WSi_2$ is preferred over $TiSi_2$ which is typically formed by depositing Ti on Si and then reacting to turn the silicide. This method of formation leads to surface roughness. The conducting diffusion barrier layer is a conducting material such as a conducting nitride. TiN is an exemplary choice. The landing pad layer functions as diffusion barrier to seal the junction. Dielectric layer 13 is typically a deposited oxide. Materials other than those mentioned may be used; consideration must be given to proper characteristics, such as etching characteristics. The first silicide layer further comprises dopants which may be ion implanted. The resist is typically a commercially available resist with due consideration being given to the sensitivity of the resist to the radiation being used to pattern the resist. Conventional lithographic patterning technique are used to pattern the resist. The structure may thus be formed using well known and conventional processing steps.

Figure 2:
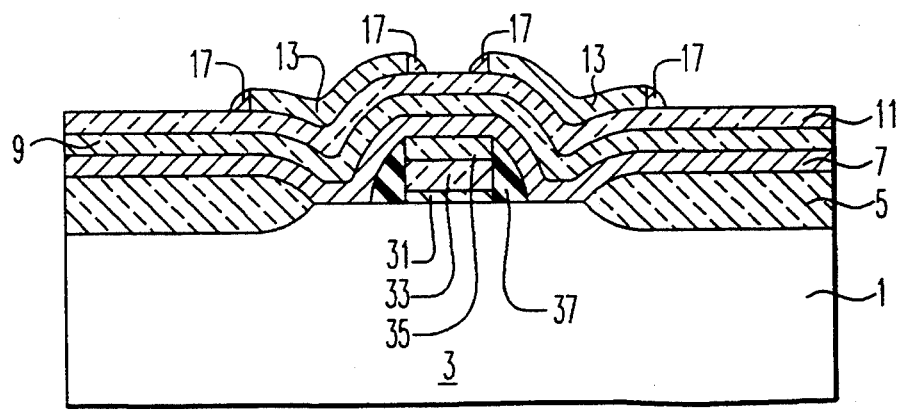
Figure 3:
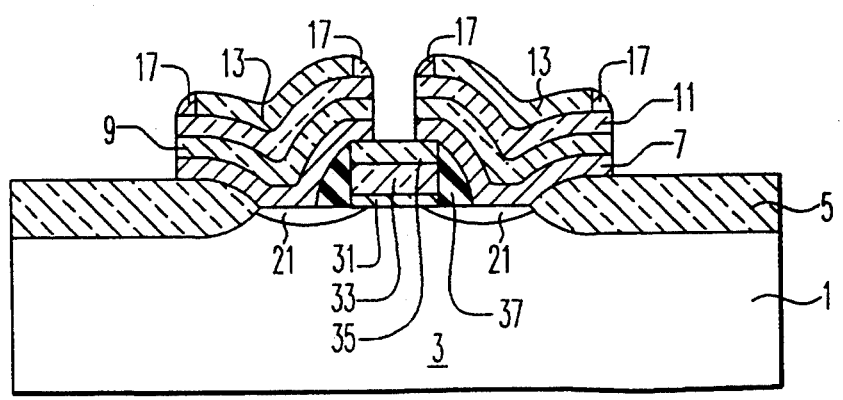

The patterned resist 15 is now used as an etch mask and the exposed portions of the dielectric layer 13 are removed thereby exposing portions of the top layer. The resist is now stripped using conventional techniques. If a sublithographic spacing between portions of the stacked landing pad layers that extend over the gate electrode is desired, a dielectric layer may be deposited and etched back to leave the dielectric spacers 17 as shown in FIG. 2. A convenient dielectric material to use is an oxide. Of course, other methods may be used to form the dielectric spacers. The patterned dielectric 13 with spacers 17 is used as an etch mask for the etching and removal of the exposed portions of the stacked landing pad layers. Dry etches having the desired selectivity between the dielectric and the silicide and landing pad layers will be readily selected by those skilled in the art. Out diffusion from the first silicide layer 7 forms source/drain regions 21. The resulting structure is depicted in FIG. 3.

The remaining dielectric layer may be removed if so desired; however, another dielectric layer 19 is typically deposited and there is therefore no compelling reason to remove dielectric layer 13 at this point in the fabrication sequence.

Figure 4:
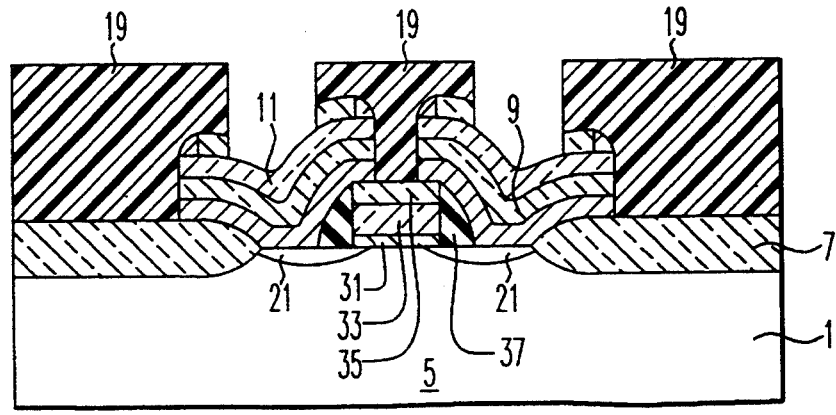

The dielectric layer 19 mentioned in the previous paragraph is now deposited and a layer of resist formed. The resist is then patterned to form openings which expose selected portions of the dielectric layer 13. The exposed portions of the dielectric layer 13 are over the portions of the stacked landing pad layers that will be exposed when the dielectric layer 13 is patterned. The exposed portions of the dielectric layer are now removed so that portions of the stacked landing pad layers are exposed. The second silicide layer 11 is used because etching layer 13 and stopping on layer 9 is often difficult. The second silicide layer may be omitted when the diffusion barrier serves as an etch stop layer. In this case, the stacked window pad layers have only two layers. The resulting structure is depicted in FIG. 4. Device fabrication is now completed using conventional processing. For example, metal is deposited in the dielectric windows exposing portions of the window landing pad sandwiches.

Several aspects of the transistor merit discussion. The formation of the shallow junctions avoids junction interface roughness. The TiN layer seals the junction against diffusion and eliminates step coverage problems that might otherwise occur in deposition of the barrier layer material. Calculations indicated that overlap between the stacked pad layer landing and the gate electrode does not contribute a significant capacitance. Additionally, using $WSi_2$ as the first layer saves one mask because it has been found that phosphorous inhibits boron diffusion which are n-type and p-type dopants, respectively.

Variations in the embodiment described will be readily thought of by those skilled in the art. If the lithographically defined spacing between portions of the landing pad layer is sufficient, spacer formation may be omitted.

We claim:

1. A method of making a field effect transistor on a substrate comprising the steps of:
    forming a gate electrode of said field effect transistor between field oxide regions, said gate electrode having an insulating top layer;
    depositing a first silicide layer and a conducting diffusion barrier layer, said first silicide layer and said barrier layer forming stacked landing pad layers, said layers being over said substrate and covering said gate electrode;
    depositing a first dielectric layer;
    forming a layer of resist;
    patterning said resist to expose portions of said dielectric layer; and
    removing said exposed portions of said dielectric layer to expose portions of said stacked landing pad layers, said removing forming a patterned dielectric layer.

2. A method as recited in claim 1 further comprising the step of:
    forming dielectric spacers on said patterned dielectric layer.

3. A method as recited in claim 1 comprising the further steps of depositing a second dielectric layer over said patterned landing pad and first silicide layers, and
    patterning said second dielectric layer to expose portions of said patterned landing pad layer.

4. A method as recited in claim 1 comprising the further step of doping said first silicide layer with dopants.

5. A method as recited in claim 4 comprising the further step of heating to cause at least some of said dopants to move from said first silicide layer to said substrate to form source/drain regions of said transistor.

6. A method as recited in claim 5 in which said dopants are n-type and p-type dopants.

7. A method as recited in claim 6 in which said n-type and p-type dopants are boron and phosphorous.

8. A method as recited in claim 1 in which said barrier layer comprises of a conducting nitride.

9. A method as recited in claim 8 in which said conducting nitride is titanium nitride.

10. A method as recited in claim 2 comprising the further step of using said patterned dielectric layer as an etch mask for etching said stacked landing pad layers.

* * * * *